United States Patent [19]

Narabu et al.

[11] Patent Number: 4,558,341
[45] Date of Patent: Dec. 10, 1985

[54] CHARGE TRANSFER WITH MEANDER CHANNEL

[75] Inventors: Tadakuni Narabu, Atsugi; Miaki Nakashio, Machida, both of Japan

[73] Assignee: Sony Corporation, Tokyo, Japan

[21] Appl. No.: 486,309

[22] Filed: Apr. 19, 1983

[30] Foreign Application Priority Data

Apr. 22, 1982 [JP] Japan ................................ 57-67890

[51] Int. Cl.[4] ...................... H01L 27/78; G11C 19/28
[52] U.S. Cl. .......................................... 357/24; 377/62
[58] Field of Search ........................ 357/24; 377/57–63

[56] References Cited

U.S. PATENT DOCUMENTS

| | | | |
|---|---|---|---|
| 3,745,383 | 7/1973 | Sangster | 357/24 |
| 3,858,232 | 12/1974 | Boyle et al. | 357/24 |
| 4,103,347 | 7/1978 | Barton | 357/24 |
| 4,291,239 | 9/1981 | Weimer | 357/24 |
| 4,371,885 | 2/1983 | Parrish et al. | 357/24 |

FOREIGN PATENT DOCUMENTS

| | | | |
|---|---|---|---|
| 55-41792 | 3/1980 | Japan | 357/24 |
| 7612053 | 5/1977 | Netherlands | 357/24 |

OTHER PUBLICATIONS

Maekawa et al., "A 2048-Element MCCD Linear Image Sensor", Fujitsu Sci. & Tech. Journal (Japan), vol. 16 (12/80), pp. 113-129.

*Primary Examiner*—Gene M. Munson
*Attorney, Agent, or Firm*—Hill, Van Santen, Steadman & Simpson

[57] ABSTRACT

A charge transfer device having a plurality of first storage regions separated from one other by a first channel stopper region and arranged along one direction, a plurality of second storage regions opposed to the first storage regions and separated from one other by a second channel stopper region and arranged along the one direction, and first and second transfer regions placed between the first and second storage regions and arranged alternately along the one direction is disclosed, in which the first and second storage regions are displaced from one other with respect to the one direction, the adjoining first and second transfer regions along the one direction are paired, each of the pairs is in common contact with the first storage regions and is in respective contact with the separated and adjoining second storage regions, and the first and second storage regions are partially protruded to the first and second transfer regions to form protrusive portions.

1 Claim, 11 Drawing Figures

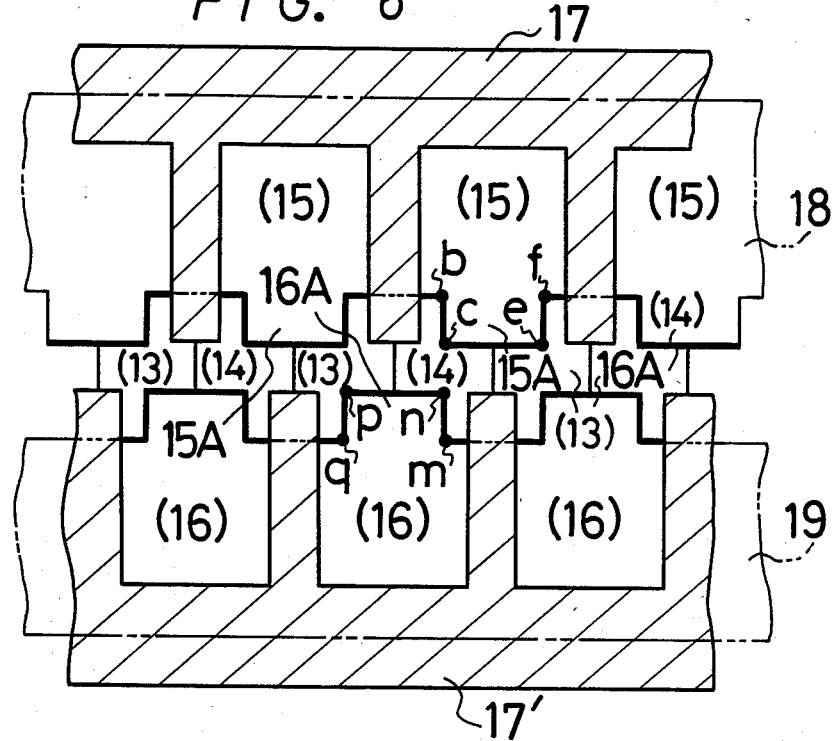
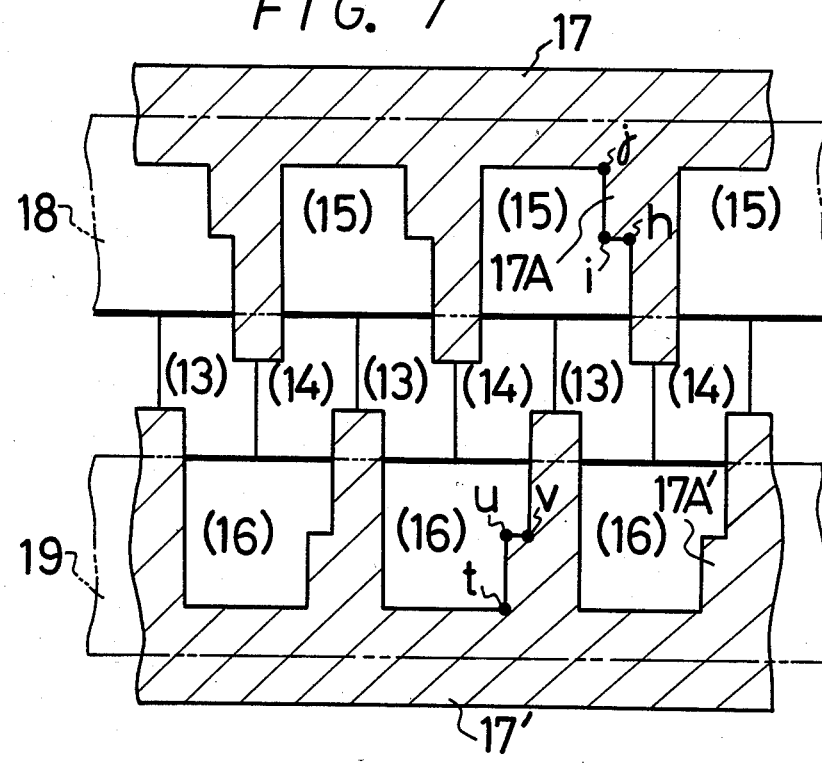

CHARGE TRANSFER WITH MEANDER CHANNEL

BACKGROUND OF THE INVENTION

1. Field of the Invention

This invention relates to charge transfer devices and more particularly is directed to a charge transfer device employing a CCD (charge coupled device).

2. Description of the Prior Art

When a CCD is employed as a solid state image pickup element or sensor, it is natural that high resolution should be expected. Considering that a CCD is incorporated into a camera, its chip size has to be made small in view of a manufacturing cost of an optical system. In order to reduce the chip size and increase the number of picture elements, it is necessary first to reduce the area of one picture element in the light receiving region of the CCD. When the chip size and the number of picture elements in the horizontal direction are determined, the transverse width of one picture element is determined. In accordance with the present manufacturing technique, the transverse width of one picture element can be formed in several microns. However, in the case of the CCD image pickup device of, for example, frame transfer system, the pitch per one bit of a horizontal register which will read out an information signal accumulated in the light receiving region has to be formed by the transverse width of one picture element, giving rise to difficulty in the manufacturing technique. Moreover, when the CCD is employed as a memory, particularly SPS (serial-parallel-serial) type memory, the serial section has to be manufactured following the width of the parallel section so that the same problem occurs.

In order to improve the aforesaid defects, the assignee who is the same as that of this invention has previously proposed a charge transfer device of zigzag-channel type employing the CCD in which the length per one bit of the horizontal register can be reduced.

FIG. 1 schematically illustrates such previously proposed charge transfer device of zigzag-channel type. As shown in FIG. 1, the charge transfer device of zigzag-channel type comprises storage electrodes 1 and 2, transfer regions 3 and 4 and storage regions 5 and 6. In this case, the storage regions 5 and 6, the depth of the potential well of which is determined by the storage electrodes 1 and 2 are opposed to each other and therebetween are located the transfer regions 3 and 4 of which the depth of the potential well is determined by transfer electrodes (not shown). The storage regions 5 and 6 are respectively encircled on three sides by channel stopper regions 7 and a signal charge is transferred in a zigzag way from the storage region 5 - the transfer region 4 - the storage region 6 - the transfer region 3 . . . as, for example, shown by a broken line arrow 8. With this arrangement, the ends of the opposing storage electrodes 1 and 2 facing to the transfer regions 3 and 4 form straight lines a-a' and b-b', respectively. The lengths in which the storage regions 5 and 6 contact with the transfer regions 3 and 4 are presented as c-e and h-j, respectively. When the charge is transferred from the storage region 5 to the storage region 6, the length of exit through which the charge is sent becomes a short line c-d and the length of entrance through which the charge enters becomes a short line h-i. For this reason, two-dimensional effect by the potential in the transfer region 4 on the potential in the storage region 5 is poor and a fringing electric field is difficult to be established in the direction of the transfer region 4. Similarly, a fringing electric field from the transfer region 4 to the storage region 6 is difficult to be established. A minimum distance k-l between the opposing portions of the channel stopper regions 7 is shorter than the minimum distance between the storage regions 5 and 6 and a potential barrier due to the potential in the channel stopper regions 7 easily appears on the line k-l in the transfer regions 4. Thus, there occurs such a case that the charge can not be transferred completely sometimes and the charge transfer efficiency is deteriorated. Since the shapes of the channel stopper regions 7 encircling the storage regions 5 and 6 are symmetrical as c-e-f-g and the potentials in the channel stopper regions 7 do not work positively for transferring the charge in the storage regions 5 to the c-d direction rather than d-e direction, the charge transfer efficiency is deteriorated.

With this prior art arrangement, when an error occurs in aligment of the masks and as shown in FIG. 2, the transfer regions 3 and 4 are shifted to left-hand side relative to the channel stopper regions 7, the length of exit of the storage region 5 to the transfer region 4 becomes narrower as in c'-d'. Accordingly, the aforesaid tendency becomes serious and the fringing electric field is made more difficult to be established so that the charge transfer efficiency is deteriorated.

OBJECTS AND SUMMARY OF THE INVENTION

Accordingly, it is an object of this invention to provide a novel charge transfer device of zigzag-channel type which can obviate the defects inherent in the prior art charge transfer device.

Another object of this invention is to provide a novel charge transfer device of zigzag-channel type which can increase the intensity of the fringing electric field in storage and transfer regions to improve the charge transfer efficiency.

According to an aspect of this invention, there is provided a charge transfer device comprising a plurality of first storage regions separated from one other by a first channel stopper region and arranged along one direction, a plurality of second storage regions opposed to said first storage regions and separated from one other by a second channel stopper region and arranged along said one direction, and first and second transfer regions placed between said first and second storage regions and arranged alternately along said one direction, wherein said first and second storage regions are displaced from one other with respect to said one direction, said first and second transfer regions adjoining along said one direction are paired, each of said pairs is in common contact with said first storage regions and is in respective contact with said separated and adjoining second storage regions, and said first and second storage regions are partially protruded to said first and second transfer regions to form protrusive portions.

The other objects, features and advantages of the present invention will become apparent from the following description taken in conjunction with the accompanying drawings through which the like references designate the same elements and parts.

BRIEF DESCRIPTION OF THE DRAWINGS

FIGS. 6 to 9 are respectively plan views illustrating other embodiments of the present invention.

DESCRIPTION OF THE PREFERRED EMBODIMENTS

Embodiments of a charge transfer device of zigzag-channel type according to this invention will be described hereinafter with reference to the drawings.

Figure 3:
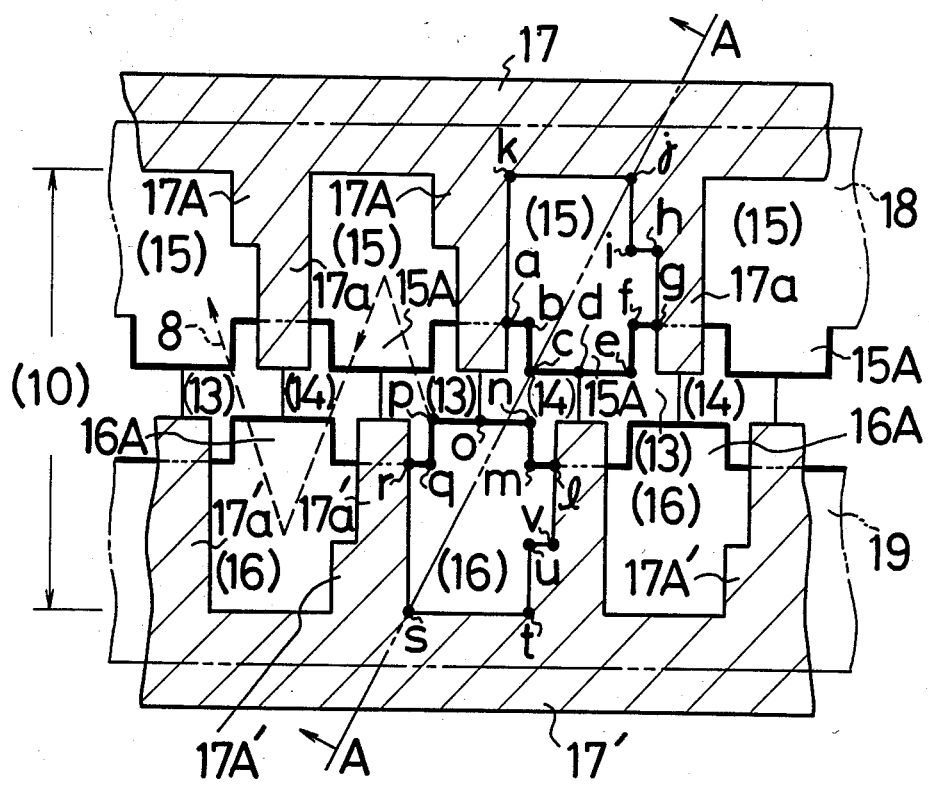
FIG. 3 is a plan view illustrating the fundamental construction of an embodiment of a charge transfer device of zigzag-channel type according to this invention.
Figure 4:
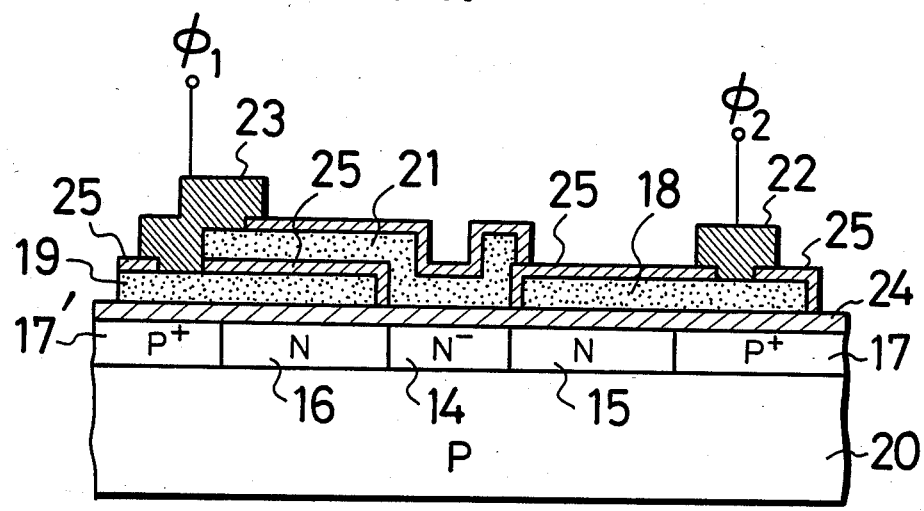
FIG. 4 is a cross-sectional view taken along a line A—A thereof.
Figure 5:
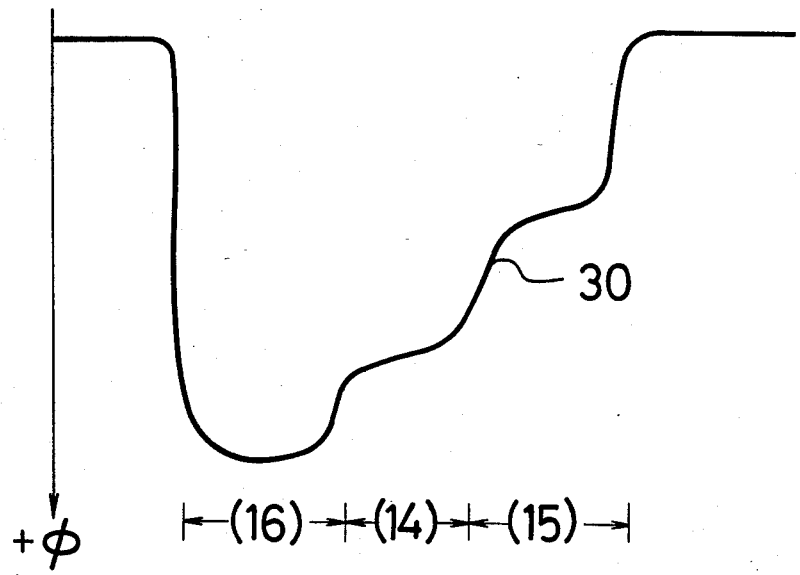
FIG. 5 is a graph indicating a potential distribution thereof.

FIG. 3 is a plan view illustrating the fundamental arrangement of the charge transfer device of this invention, FIG. 4 is a cross-sectional view taken along a line A—A thereof and FIG. 5 is a graph illustrating a potential distribution thereof. In this invention, a one-conductivity type semiconductor substrate, for example, P-type semiconductor substrate 20 is provided on its one major surface with first and second P+ type regions 17 and 17' forming channel stopper regions which are each in a comb-tooth shape and extended alternately from the both sides of a transfer channel 10 so as to grip the same therebetween as shown by cross-hatchings in the figure. N-type regions 15 which become first storage regions are formed on the major surface of the substrate 20 at the portions divided by the comb-tooth portions 17a of the first channel stopper regions 17. Similarly, N-type regions 16 which become second storage regions are formed on the major surface of the substrate 20 at the portions divided by the comb-tooth portions 17a' of the second channel stopper regions 17'. Further, on the major surface of the substrate 20 between the first and second storage regions 15 and 16 are formed a plurality of N− type regions 13 and 14 which become first and second transfer regions. The first and second transfer regions 13 and 14 are placed alternately in one direction. The first and second storage regions 15 and 16 are located to be displaced to each other by ½ pitch each relative to the above one direction. Accordingly, in this case, if the adjoining first and second transfer regions 13 and 14 are paired, the first and second transfer regions 13 and 14 are in common contact with the corresponding first storage regions 15 and in the second storage regions 16, they are in contact with the adjoining different storage regions 16 and 16 which are divided by the channel stopper regions 17'.

The surface of the substrate 20 is coated with an insulating layer 24, and on the insulating layer 24 is formed a first layer, for example, polysilicon layer which becomes first and second storage electrodes 18 and 19, respectively. Further, a second polysilicon layer which forms a second transfer electrode 21 is formed thereon through an insulating layer 25. The second transfer electrode 21 corresponds to the second transfer region 14. Although not shown, a transfer electrode corresponding to the first transfer region 13 is similarly formed on the second polysilicon layer as a third polysilicon layer through an insulating layer. Meanwhile, in the first and second storage regions 15 and 16, the transfer region sides thereof are respectively protruded to form, for example, rectangular protrusive portions 15A and 16A as shown by b-c-e-f and m-n-p-q. These protrusive portions 15A and 16A are formed symmetrically relative to the first and second transfer regions 13 and 14 each of which is in contact therewith. In the channel stopper regions 17 and 17' encircling the storage regions 15 and 16, in order that they may become asymmetrical in the right and left hand sides, the portions corresponding to the rear with regards to the charge transfer direction 8 are protruded to the sides of the storage regions 15 and 16 to form, for example, rectangular protrusive portions 17A and 17A' as shown by h-i-j and t-u-v.

The first storage electrode 18 and the first transfer electrode (not shown) are electrically connected together through, for example, an aluminium conductor 22 and the second storage electrode 19 and the second transfer electrode 21 are connected electrically together through a like aluminium conductor 23 to which 2-phase clock voltages $\phi_2$ and $\phi_1$ are applied, respectively.

By the clock voltages $\phi_1$ and $\phi_2$, the signal charge is transferred zigzag to one direction in the order of the first storage region 15 - the second transfer region 14 - the second storage region 16 - the first transfer region 13 - the first storage region 15 .... FIG. 5 is a graph showing a potential distribution 30 in the first storage region 15 - the second transfer region 14 - the second storage region 16 when the clock voltage $\phi_1$ is on and the clock voltage $\phi_2$ is off.

According to the arrangement as described above, since the transfer region side of the first storage region 15 is protruded as shown by b-c-e-f, the length of the exit of the storage region 15 is increased by b-c amount as compared with that of the prior art. Thus, a two-dimensional effect by the potential in the second transfer region 14 is increased and a fringing electric field in the direction to the second transfer region 14 becomes larger. Since the transfer region side of the second storage region 16 is protruded as shown by m-n-p-q, from the same reason, the two-dimensional effect by the potential of the storage region 16 to the potential in the second transfer region 14 becomes large and the fringing electric field in the direction to the second storage region 16 becomes larger. Besides, since the lengths b-c and m-n are not affected by the displacement of the masks, the influence upon the intensity of the fringing electric field due to the displacement of the masks is small as compared with that of the prior art. Moreover, since the minimum distance between the opposing first and second storage regions 15 and 16 becomes c-n and is shorter than that of the prior art, it is possible to prevent a potential barrier from being caused by the influence of potentials in the channel stopper regions 17 and 17', namely, the comb-tooth portions 17a and 17a' thereof.

Furthermore, since the part of the channel stopper region 17 encircling the storage region 15 is protruded toward the storage region 15 side so as to be asymmetrically as shown by h-i-j, the influence of the potential in the channel stopper region 17 exerts on the near-by storage region 15 so that the electric field vector of the storage regions 15 is oriented in the direction to the transfer region 14. Also, in the channel stopper region 17' encircling the storage region 16, the part thereof is similarly protruded toward the storage region 16 side as shown by t-u-v, so that the same action and effect can be achieved. Thus, the signal charge transferred from the storage region 15 can be given a directivity and the transfer efficiency can be improved.

While in the aforesaid arrangement the storage regions 15 and 16 are provided with the protrusive portions 15A and 16A which are protruded to the transfer regions 13 and 14 and the channel stopper regions 17 and 17' encircling the storage regions 15 and 16 are provided with the protrusive portions 17A and 17A' which are protruded to the storage regions 15 and 16, these protrusive portions 15A, 16A and 17A, 17A', even when formed independently, can achieve the same effect. FIGS. 6 and 7 illustrate other embodiments of this invention. Namely, FIG. 6 shows the embodiment in which the transfer region sides of the storage regions 15 and 16 are protruded to form the protrusive portions 15A and 16A, as shown by b-c-e-f and m-n-p-q. FIG. 7 shows the embodiment in which the channel stopper regions 17 and 17' encircling the storage regions 15 and 16 are protruded at their portions corresponding to the rear sides in the direction in which the charge is transferred to form the protrusive portions 17A and 17A' as shown by h-i-j and t-u-v.

Figure 8:
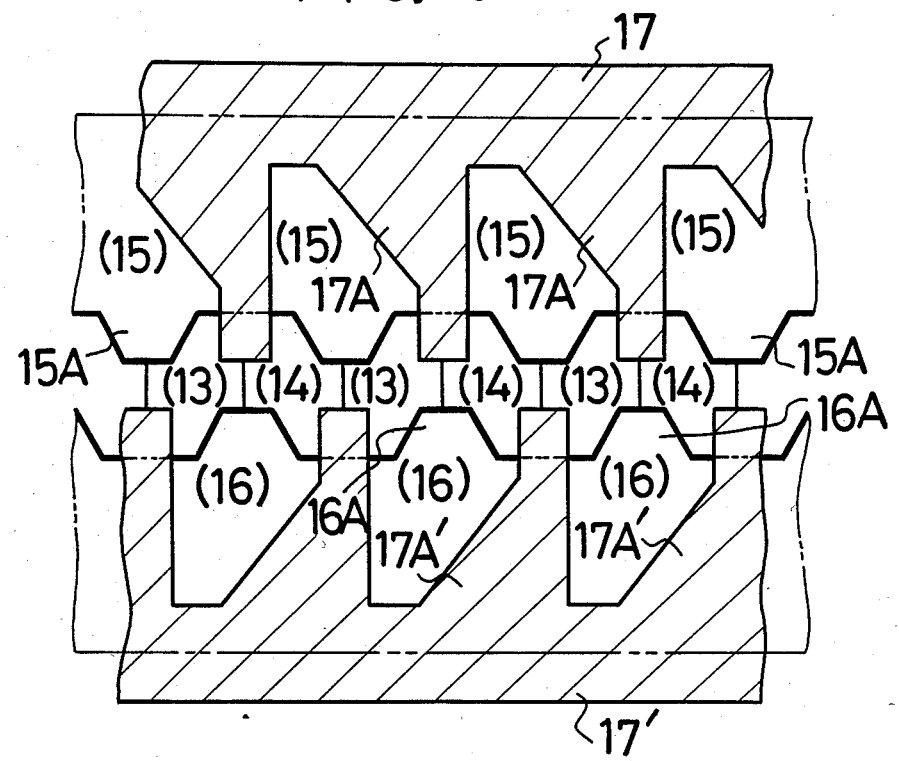
Figure 9:
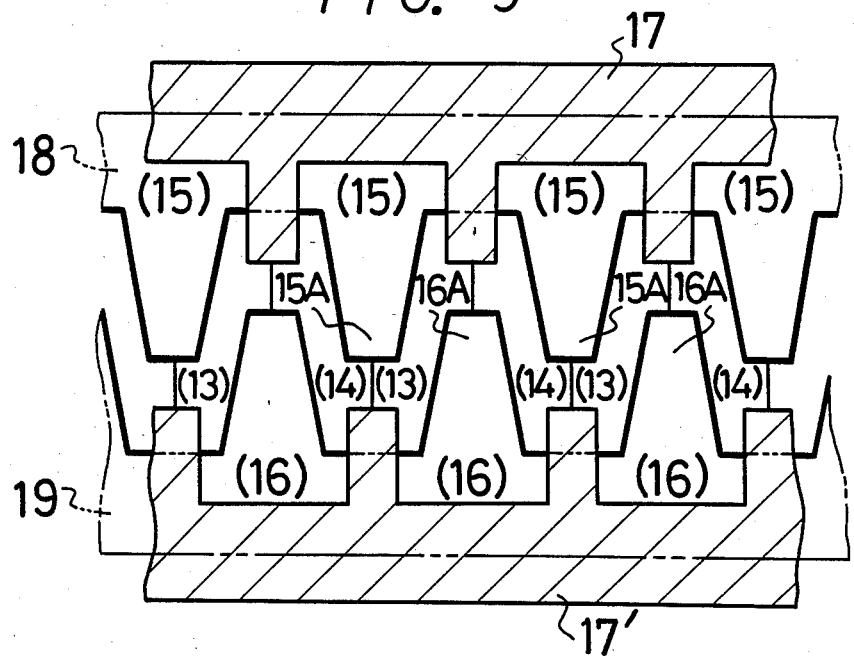

The protrusive portions 15A, 16A and 17A, 17A' are not necessarily formed as rectangular shapes but can take various shapes. In the embodiment of, for example, FIG. 8, the protrusive portions 15A and 16A of the storage regions 15 and 16 are formed as trapezoidal shapes and the protrusive portions 17A and 17A' of the channel stopper regions 17 and 17' are formed as triangular shapes. In the embodiment of FIG. 9, the area of each of the protrusive portions 15A and 16A of the storage regions 15 and 16 is increased.

Figure 1:
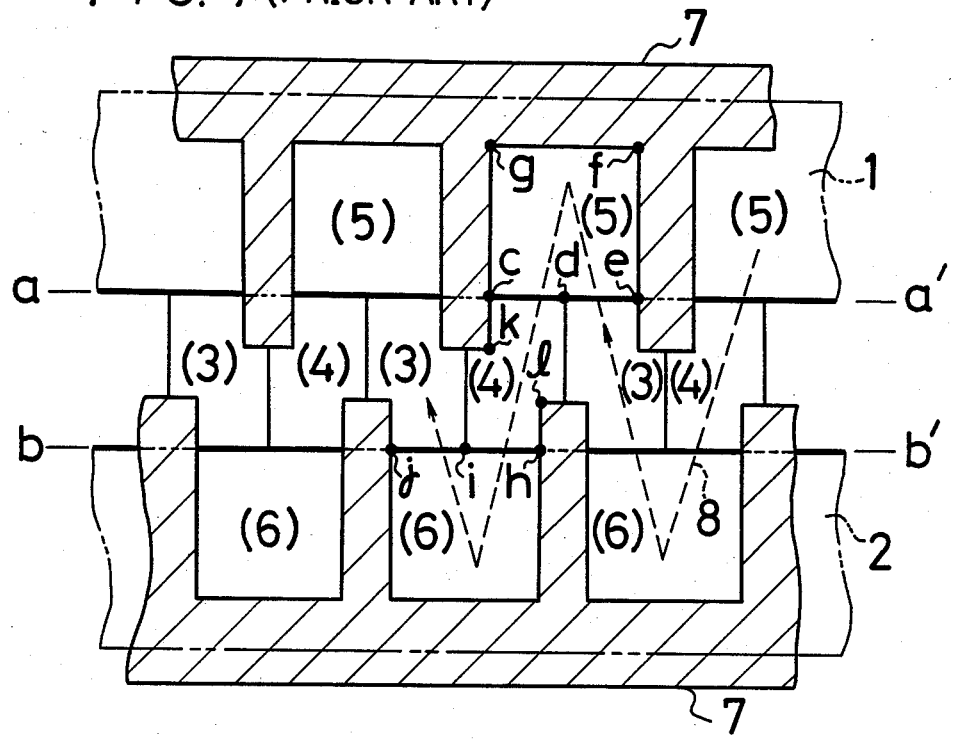
FIGS. 1 and 2 are respectively plan views illustrating an example of a prior art charge transfer device of zigzag-channel type.
Figure 2:
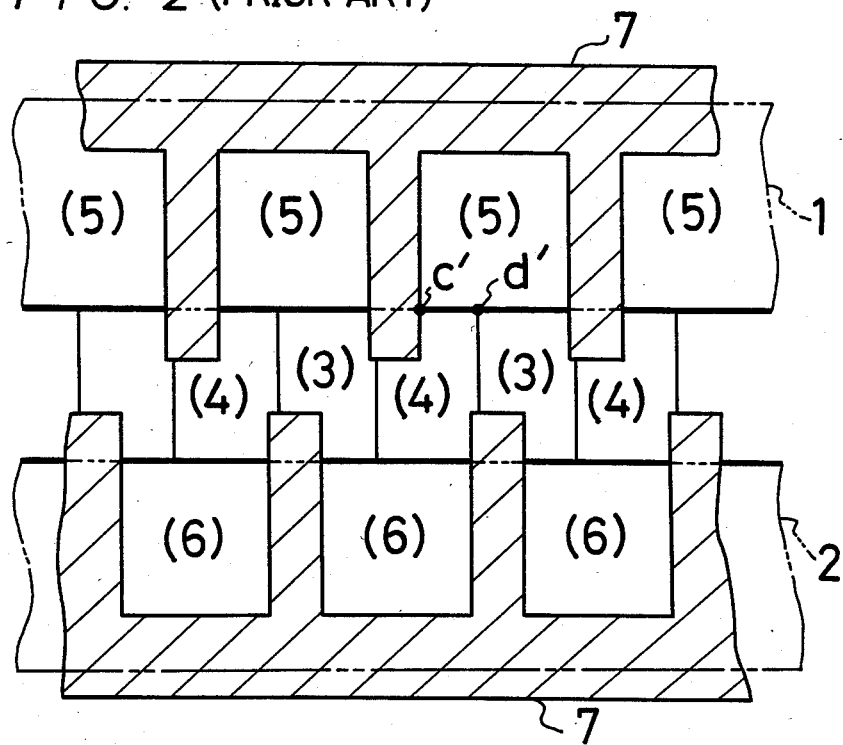
Figure 10:
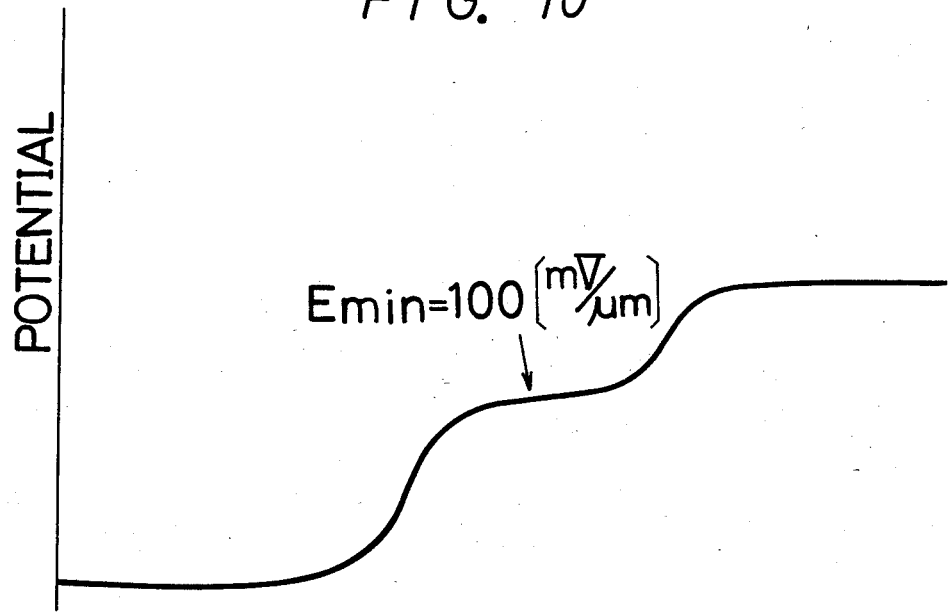
FIGS. 10 and 11 are respectively graphs indicating the potential distributions of the charge transfer devices according to the prior art and the present invention in the transfer regions.
Figure 11:
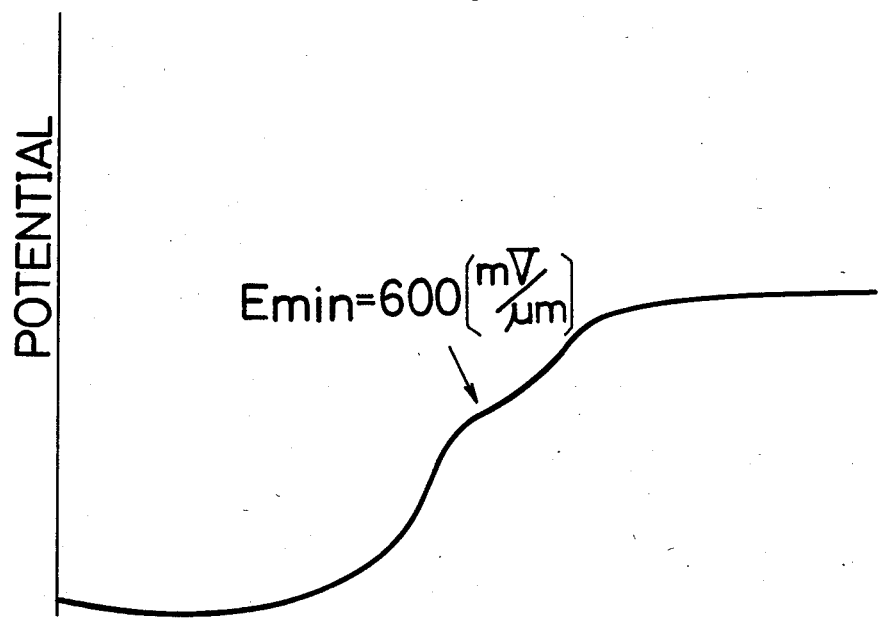

FIG. 10 is a graph indicating a minimum potential in the transfer region of the prior art charge transfer device of zigzag channel type shown in FIG. 1. The minimum electric field in the transfer region is substantially 100 mV/$\mu$m. FIG. 11 is a graph indicating a minimum potential in the transfer region of the charge transfer device of zigzag channel type according to the present invention. The minimum electric field in the transfer region is substantially 600 mV/$\mu$m. Comparing both the minimum electric fields, it is understood that the minimum electric field according to this invention becomes six times as large as that of the prior art. Namely, it is understood that the fringing electric field becomes large and the charge transfer efficiency is improved.

As described above, according to this invention, since parts of the storage regions are protruded to the transfer regions and parts of the channel stopper regions encircling the storage regions are also protruded to the storage regions, it is possible to increase the intensity of the fringing electric field in the transfer direction to the storage regions and the transfer regions. Thus, the transfer efficiency in the charge transfer device of zigzag channel type can be improved.

The above description is given on the preferred embodiments of the invention, but it will be apparent that many modifications and variations could be effected by one skilled in the art without departing from the spirits or scope of the novel concepts of the invention, so that the scope of the invention should be determined by the appended claims only.

We claim as our invention:

1. A charge transfer device comprising a plurality of first storage regions (15) separated from one other by a first channel stopper region (17) and arranged in a first longitudinal direction, a plurality of second storage regions (16) opposed to said first storage regions, separated from one other by a second channel stopper region (17') and arranged along said one direction, and first and second transfer regions (13, 14) placed between said first and second storage regions and arranged alternately along said one direction, wherein said first and second storage regions are displaced from one other with respect to said one direction, said first and second transfer regions adjoining along said one direction are paired, each of said pairs is in common contact with said first storage regions and is in respective contact with said separated and adjoining second storage regions, said first and second storage regions having first portions which extend transversely to said first direction a distance greater than other portions of said first and second storage regions and said first portions of said first and second storage regions being longitudinally offset from each other, to said first and second transfer regions to form protrusive portions, and portions of said first and second channel stopper regions which correspond to the rear in the charge transfer direction being asymmetrical having first portions in the rear thereof which extend transverse to said first direction a distance greater than the rear back edges of said first and second channel stopper regions and said first portions of said first and second channel stopper regions being longitudinally offset from each other.

* * * * *